(12) United States Patent
Tian et al.

(10) Patent No.: US 11,437,387 B2
(45) Date of Patent: Sep. 6, 2022

(54) STACK CAPACITOR, A FLASH MEMORY DEVICE AND A MANUFACTURING METHOD THEREOF

(71) Applicant: SHANGHAI HUALI MICROELECTRONICS CORPORATION, Shanghai (CN)

(72) Inventors: Zhi Tian, Shanghai (CN); Juanjuan Li, Shanghai (CN); Hua Shao, Shanghai (CN); Haoyu Chen, Shanghai (CN)

(73) Assignee: SHANGHAI HUALI MICROELECTRONICS CORPORATION, Shanghai (CN)

( * ) Notice: Subject to any disclaimer, the term of this patent is extended or adjusted under 35 U.S.C. 154(b) by 0 days.

(21) Appl. No.: 17/213,885

(22) Filed: Mar. 26, 2021

(65) Prior Publication Data

US 2021/0305265 A1    Sep. 30, 2021

(30) Foreign Application Priority Data

Mar. 26, 2020   (CN) .......................... 202010224926.4

(51) Int. Cl.
| | |
|---|---|
| *H01L 21/00* | (2006.01) |
| *H01L 27/11536* | (2017.01) |
| *H01L 27/06* | (2006.01) |
| *H01L 27/11539* | (2017.01) |
| *H01L 49/02* | (2006.01) |
| *H01L 29/66* | (2006.01) |
| *H01L 29/788* | (2006.01) |

(52) U.S. Cl.
CPC .... *H01L 27/11536* (2013.01); *H01L 27/0629* (2013.01); *H01L 27/11539* (2013.01); *H01L 28/40* (2013.01); *H01L 29/66825* (2013.01); *H01L 29/788* (2013.01)

(58) Field of Classification Search
CPC ........... H01L 27/11536; H01L 27/0629; H01L 28/40; H01L 29/66825; H01L 29/788
See application file for complete search history.

(56) References Cited

U.S. PATENT DOCUMENTS

| | | | |
|---|---|---|---|
| 2001/0024385 A1* | 9/2001 | Ahn | .................... G11C 16/0416 365/200 |
| 2017/0025429 A1* | 1/2017 | Jen | ....................... H01L 27/0629 |
| 2021/0305265 A1* | 9/2021 | Tian | .................. H01L 27/11531 |
| 2022/0108997 A1* | 4/2022 | Hekmatshoartabari | ..................... H01L 29/7883 |

* cited by examiner

*Primary Examiner* — Richard A Booth
(74) *Attorney, Agent, or Firm* — Alston & Bird LLP

(57) ABSTRACT

The present disclosure provides a stack capacitor, a flash memory device, and a manufacturing method thereof. The stack capacitor of the flash memory device has a a memory transistor structure which at least comprises a substrate, and a tunneling oxide layer, a floating gate layer, an interlayer dielectric layer and a control gate layer which are sequentially stacked on the substrate, the interlayer dielectric layer of the stack capacitor comprises a first oxide layer and a nitride layer; the stack capacitor further comprises a first contact leading out of the control gate layer and a second contact leading out of the floating gate layer. The capacitance per unit area of the stack capacitor provided by the disclosure is effectively improved, and the size of the transistor device is reduced. The manufacturing method according to the disclosure does not add any additional photomask than a conventional process flow.

5 Claims, 14 Drawing Sheets

STACK CAPACITOR, A FLASH MEMORY DEVICE AND A MANUFACTURING METHOD THEREOF

CROSS-REFERENCES TO RELATED APPLICATIONS

This application claims the priority to Chinese patent application No. CN 202010224926.4, filed on Mar. 26, 2020 at CNIPA, and entitled "A stack capacitor, a flash memory device and a manufacturing method thereof", the disclosure of which is incorporated herein by reference in entirety.

TECHNICAL FIELD

The present disclosure relates to the field of semiconductors, in particular, to a floating gate flash memory device structure and a manufacturing process thereof.

BACKGROUND

Flash memory devices have been widely used as the best choice for non-volatile memory applications due to its advantages of high density, low price, and electrical programmability/erasability. Some capacitor structures are placed in the flash memory devices. Typically the existing capacitor structures comprise diodes, metal oxide semiconductor (MOS) capacitors, and the like. These capacitors are formed using different device components. For example, for a 1.8V/5.0V device area in a flash memory, the well and source/drain regions of either a 1.8V or 5.0V device are used in combination to form the capacitor.

Meanwhile, since the early inventions of integrated circuits by Dr. Jack Kilby of Texas Instruments, scientists and engineers have created a lot of semiconductor devices and developed their fabrication processes through inventions and improvements. In the past 50 years, the critical dimensions of semiconductor chips have been significantly reduced, which have translated into increased processor speeds and decreased power consumption. Up to now, development of integrated circuits has roughly followed Moore's law, that the number of transistors on a microchip doubles every two years. At present time, semiconductor chip fabrication processes are developing toward below 20 nm note, and a number of manufacturers are embarking on the 14 nm process. Just to provide a reference herein, a silicon atom has the size of about 0.2 nm, so the pitch distance between two separate features manufactured by a 20 nm process contains about only one hundred silicon atoms.

Demand for ever smaller chip sizes requires continuous area reduction of individual circuit elements of semiconductor devices. Semiconductor device manufacturing has therefore become more challenging as it moves towards the limits of physical possibilities.

For flash memory structures, the logic area is one of the core areas of the device. The ratio of logic area to wafer area under different technology nodes has increased as the flash memory nodes progresses. Referring to FIG. 1, which is a comparison chart showing the proportion of logical area in Nor Flash under different technological nodes. As can be seen from FIG. 1, although the proportion of the logic area in Nor Flash decreases as the product capacity increases, for different technology nodes with the same capacity (three generation nodes of 55 nm, 55 nm and 65 nm are shown in the figure), the proportion of the logic area in Nor Flash actually increases as the technology nodes decrease. This is a limiting factor in achieving reduction of the overall chip area, therefore, it is necessary to investigate how to reduce the logic area. In order to reduce the logic area and the ratio of the logic area in the device to achieve the effect of shrinking the wafer area, one has to consider the feasibility of how effectively to increase the capacitance density.

SUMMARY OF THE DISCLOSURE

A brief summary on one or more embodiments is provided below as an explanation for the embodiments. This summary is not an exhaustive overview of all the contemplated embodiments and is neither intended to indicate critical or decisive elements of all embodiments nor to attempt to define the scope of any or all embodiments. Its sole purpose is to present some concepts of one or more embodiments in a simplified form as a preface for a more detailed description presented later.

In order to solve the above problems, the present disclosure provides a stack capacitor in a flash memory transistor, wherein the stack capacity has a flash memory structure, including at least a substrate, and a tunnel oxide layer, a floating gate layer, an interlayer dielectric layer and a control gate layer sequentially stacked on the substrate from bottom to top along a normal direction of the substrate, wherein, the interlayer dielectric layer of the stack capacitor comprises a first oxide layer and a nitride layer which are sequentially stacked from bottom to top along the normal direction of the substrate; and the stack capacitor further comprises a first contact leading out of the control gate layer and a second contact leading out of the floating gate layer, so that the floating gate layer and the control gate layer form a pair of plates of the stack capacitor under an applied voltage.

Optionally, the stack capacitor further comprises third contacts that respectively lead out of source and drain regions of the structure of the memory transistor, the source and drain regions are positioned in the top surface of the substrate; and the third contacts are connected in parallel with the first contact, so that the floating gate layer and the substrate form another pair of electrodes of the stack capacitor under an applied voltage.

In an embodiment of the stack capacitor, optionally, an equivalent electrical thickness of the interlayer dielectric layer of the stack capacitor is slightly greater than an equivalent electrical thickness of the tunnel oxide layer.

The present disclosure further provides a flash memory device, the flash memory device at least comprises a memory transistor area and a stack capacitor area, wherein a memory transistor in the memory transistor area at least comprises a substrate, and a tunneling oxide layer, a floating gate layer, an interlayer dielectric layer and a control gate layer which are sequentially stacked on the substrate from bottom to top along the normal direction of the substrate, and a stack capacitor in the stack capacitor area has the structure of a memory transistor, wherein, the interlayer dielectric layer of the stack capacitor comprises a first oxide layer and a nitride layer which are sequentially stacked from bottom to top along the normal direction of the substrate; and the stack capacitor further comprises a first contact leading out of the control gate layer and a second contact leading out of the floating gate layer, so that the floating gate layer and the control gate layer form a pair of electrodes of the stack capacitor under an applied voltage.

Optionally, the stack capacitor further comprises third contacts that respectively lead out of source and drain regions of the structure of the memory transistor, the source and drain regions are positioned in the top surface of the substrate; and the third contacts are connected in parallel with the first contact, so that the floating gate layer and the substrate form another pair of electrodes of the stack capacitor under an applied voltage.

Optionally, an equivalent electrical thickness of the interlayer dielectric layer of the stack capacitor is greater than an equivalent electrical thickness of the tunnel oxide layer.

Optionally, the interlayer dielectric layer of the memory transistor comprises a first oxide layer, a nitride layer, and a second oxide layer stacked from bottom to top along the normal direction of the substrate.

Optionally, the flash memory device further comprises a low voltage device area, a low voltage device in the low voltage device area comprises at least a substrate, a control gate over the substrate, and an interlayer dielectric layer between the substrate and the control gate; and the interlayer dielectric layer of the low-voltage device at least comprises a low-voltage thin oxide layer with the thickness smaller than that of the second oxide layer.

The present disclosure further provides a manufacturing method of a flash memory device, the flash memory device comprising at least a memory transistor area and a stack capacitor area, the method comprising: synchronously and sequentially forming a tunneling oxide layer, a floating gate layer and an interlayer dielectric layer comprising a first oxide layer, a nitride layer and a second oxide layer on the substrate of the memory transistor area and the stack capacitor area; removing the second oxide layer on the top of the interlayer dielectric layer of the stack capacitor area; synchronously forming a control gate layer and a first contact leading out of the control gate layer over the interlayer dielectric layer of the memory transistor area and the stack capacitor area; and forming a second contact leading out of the floating gate layer of the stack capacitor area, so that the floating gate layer and the control gate layer of the stack capacitor area form a pair of electrodes of the stack capacitor under an applied voltage.

Optionally, the manufacturing method further comprises: synchronously forming source and drain regions on the top of the substrate of the memory transistor area and the stack capacitor are; forming third contacts for leading out of the source and drain regions of the stack capacitor area; and the third contacts are connected in parallel with the first contact of the stack capacitor area, so that the floating gate layer and the substrate of the stack capacitor area form another pair of electrodes of the stack capacitor under an applied voltage.

Optionally, removing the second oxide layer from the top of the interlayer dielectric layer of the stack capacitor area further comprises: removing the second oxide layer by taking the nitride layer of the interlayer dielectric layer of the stack capacitor area as an etching stop layer so as to control an equivalent electrical thickness of the interlayer dielectric layer of the stack capacitor area to be slightly greater than that of the tunneling oxide layer.

Optionally, the flash memory device further comprises a low voltage device area, wherein a low voltage device in the low voltage device area comprises at least a substrate, a control gate over the substrate, and an interlayer dielectric layer between the substrate and the control gate; wherein the manufacturing method further comprises: forming an interlayer dielectric layer at least comprising a high-voltage thick-oxide layer above the substrate of the low-voltage device area; removing the second oxide layer on the top of the interlayer dielectric layer of the stack capacitor area further comprises: synchronously removing the high-voltage thick-oxide layer on the top of the interlayer dielectric layer of the low-voltage device area.

Optionally, the manufacturing method further comprises: forming a low-voltage thin-oxide layer with the thickness smaller than that of the second oxide layer above the substrate of the low-voltage device area after the high-voltage thick-oxide layer of the low-voltage device area is removed.

According to the present disclosure, the existing thick silicon oxide removing step is still utilized in forming the stack capacitor area, and the silicon oxide on the uppermost layer of the interlayer dielectric layer such as silicon oxide-silicon nitride-silicon oxide (ONO) between the floating gate layer and the control gate layer is removed (using silicon nitride as a stop layer). The capacitance of the stack capacitor is improved by reducing the thickness of the interlayer dielectric layer. The capacitance per unit area is effectively improved at the same time ensuring the stability of the stack capacitor, so that the occupied area of a logic area is reduced. The manufacturing method according to the disclosure does not add any photomask, thereby there is no increase of the manufacturing cost. In addition, the manufacturing method provided by the disclosure can be compatible with the existing process flow.

BRIEF DESCRIPTION OF THE DRAWINGS

After reading the detailed description of the embodiments of the present disclosure in combination with the following drawings, the above features and advantages of the disclosure can be better understood. In the drawings, the components are not necessarily drawn to scale, and components with similar related characteristics or features may have the same or similar reference marks.

Figure 1:
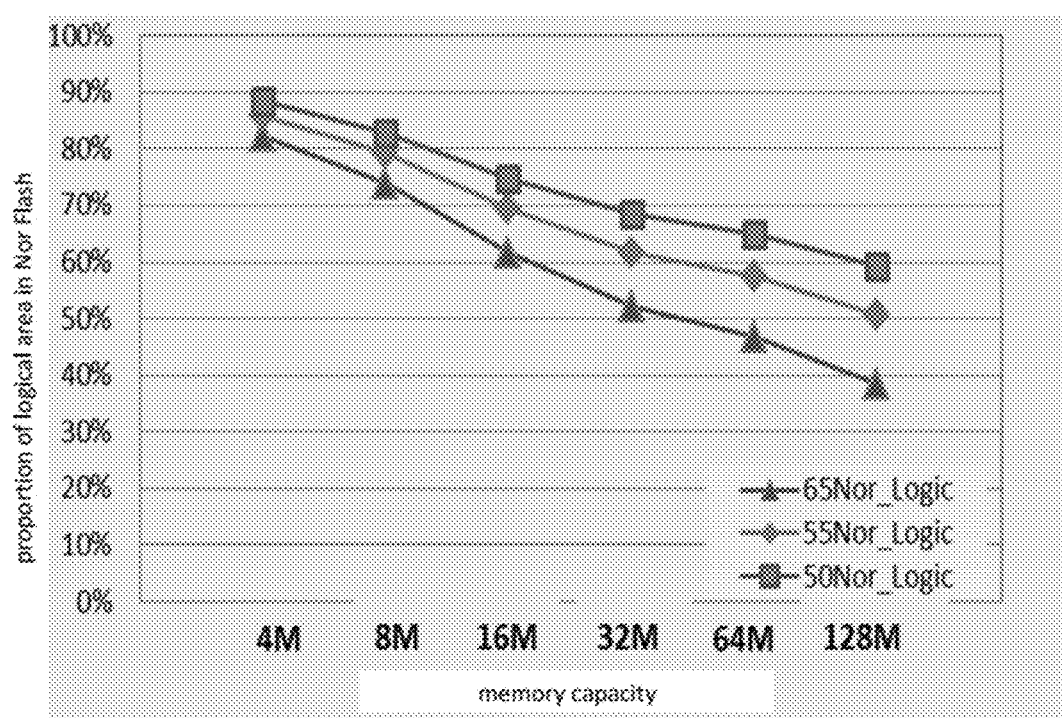
FIG. 1 shows a comparison chart of the proportion of logic area in Nor Flash in different technological nodes.

REFERENCE SIGNS 100 substrate
110 active area/P-well
111 source/drain region
120 shallow trench isolation
210 tunnel oxide layer
220 floating gate layer
230 interlayer dielectric layer
231 first oxide layer
232 nitride layer
233 second oxide layer
240 control gate layer
250 side wall
400 flash memory device
410 memory transistor region
420 stack capacitor area
430 high voltage device area
440 low voltage device area
510 first contact
520 second contact
530 third contacts
730 interlayer dielectric layer

DETAILED DESCRIPTION OF THE DISCLOSURE

The disclosure is described in detail below with reference to the figures and the specific embodiments. It is noted that the embodiments described below in connection with the figures and the specific embodiments are only illustrative and should not be construed as imposing any limitation on the scope of the present disclosure.

The disclosure relates to a floating gate based flash memory device structure and a manufacturing process thereof. More specifically, embodiments of the present disclosure also provide a stack capacitor structure in a flash memory device. The stack capacitor, the flash memory structure and the manufacturing method thereof can improve the capacitance of the stack capacitor, and can effectively improve the capacitance per unit area under the condition of ensuring the stability of the stack capacitor, thereby reducing the area occupied by the logic area. This technique supports continuous reduction of the unit memory size, so ensures the competitiveness of a small-size memory unit. The manufacturing flow provided by the disclosure does not need additional photomask, therefore it will not increase the manufacturing cost. In addition, the manufacturing method provided by the disclosure is compatible with the standard process flow.

The following description is presented to enable one of ordinary skill in the art to implement and use the present disclosure and incorporate it into the context of a particular application. Various modifications, as well as various usages in various applications, will be readily apparent to those skilled in the art, and the generic principles defined herein may be applicable to a wide range of embodiments. Thus, the present disclosure is not limited to the embodiments presented herein, but rather should be given its broadest scope consistent with the principles and novel features disclosed herein.

In the following detailed description, numerous specific details are set forth to provide a more thorough understanding of the present disclosure. However, it will be apparent to those skilled in the art that the present disclosure may be practiced without limitations from these specific details. In other words, well-known structures and devices are shown in a block diagram form and are not shown in detail, so as to avoid obscuring the present disclosure.

The reader is cautioned as to all files and documents which are filed at the same time as this specification and which are open for the public to consult, and the contents of all such files and documents are incorporated herein by reference. Unless directly stated otherwise, all features disclosed in this specification (including any of the appended claims, the abstract, and the accompanying drawings) may be replaced by alternative features serving the same, equivalent, or similar purposes. Therefore, unless expressly stated otherwise, each of the features disclosed is only one example of a group of equivalent or similar features.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 2:
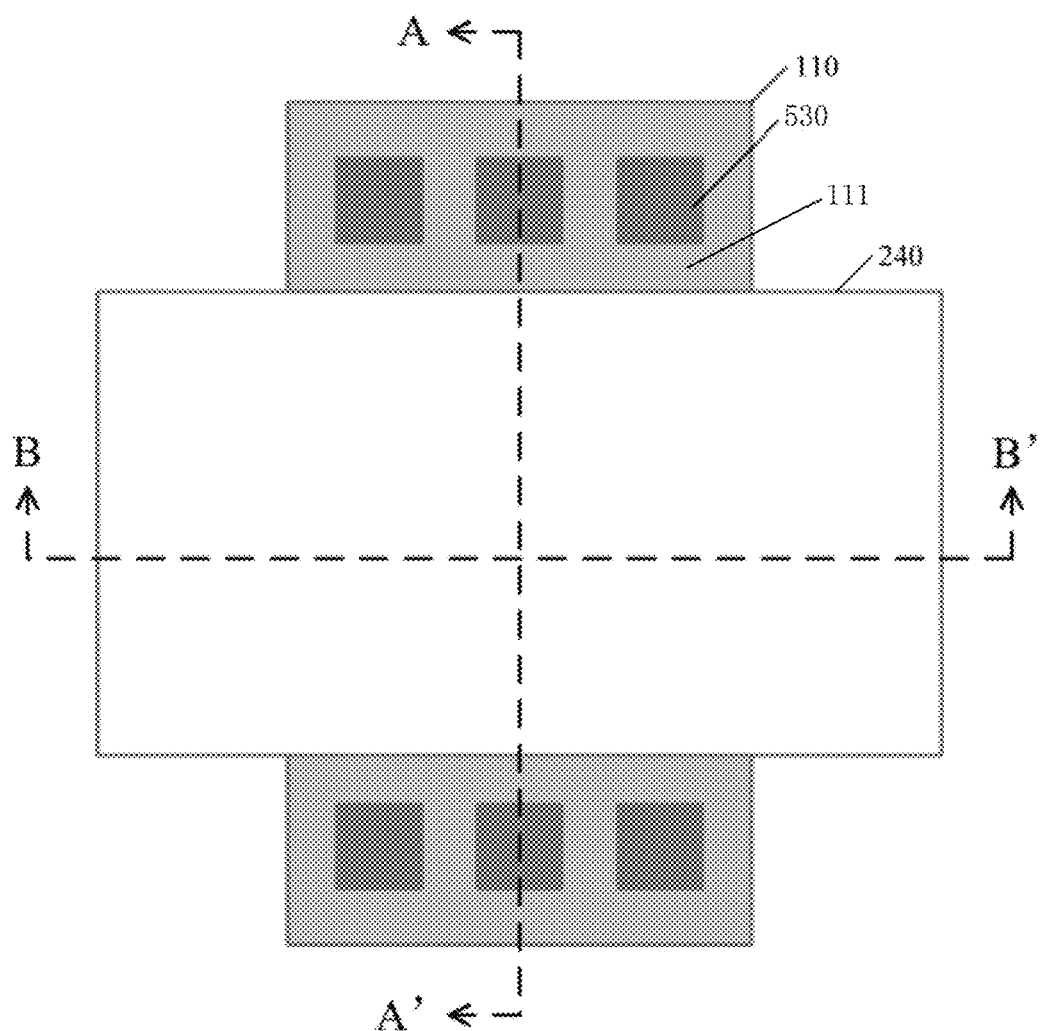
FIG. 2 shows a schematic top view of a memory transistor in a flash memory device according to an embodiment of the present disclosure.

As described above, in order to reduce the area of the logic area, the present disclosure provides a stack capacitor structure and a flash memory device comprising the same. FIG. 2 is a schematic top view of memory transistors (core device) in a flash memory device provided by the present disclosure. As shown in FIG. 2, the memory transistor comprises an active area 110 formed in a substrate and a control gate 240 located over the substrate. As can be seen from FIG. 2, in the flash memory device, the active area 110 of the memory transistor extends along the vertical direction in FIG. 2, a source/drain ion implantation region 111 of the memory transistor is further formed in the active area 110, and the control gate 240 of the memory transistor extends along the horizontal direction in FIG. 2. Please refer to FIGS. 3A and 3B together to understand the detailed structure of the memory transistor from the directions A-A' and B-B' in FIG. 2.

Figure 3A:
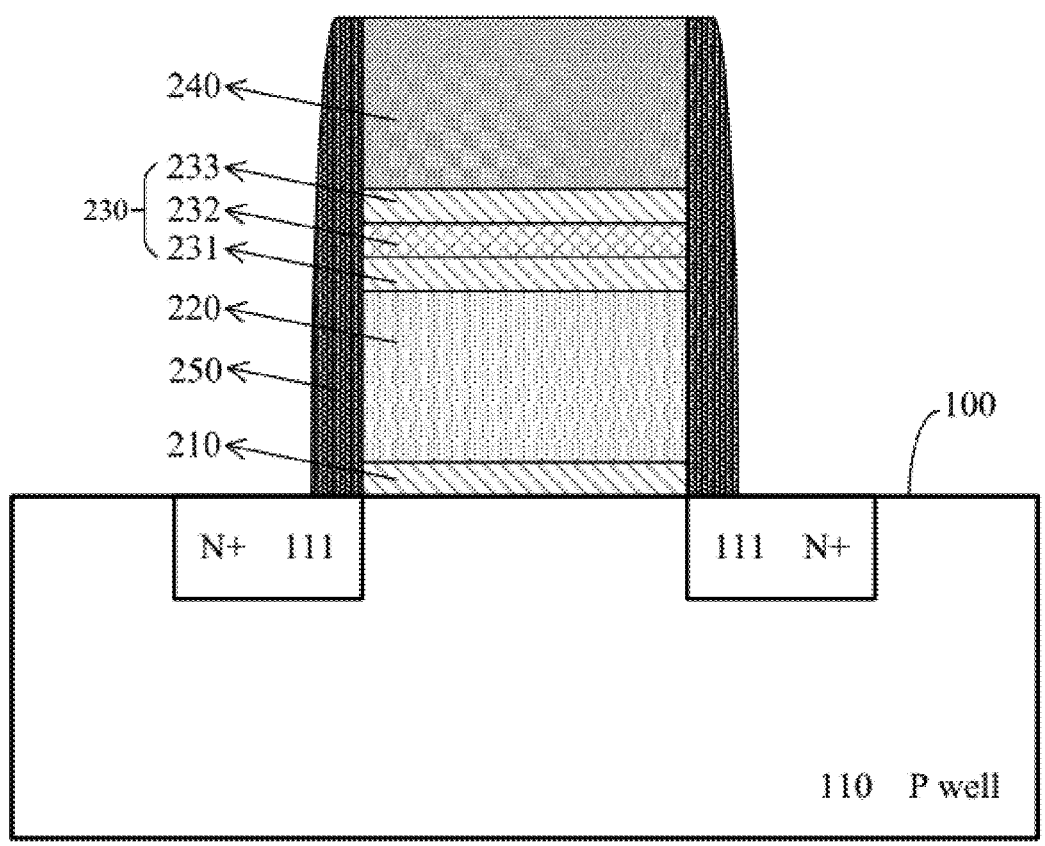
FIG. 3A shows a cross sectional view of the memory transistor/stack capacitor structure along the cut line A-A' in FIG. 2.

As shown in FIG. 3A, along the cut line A-A', the memory transistor comprises a substrate 100, and a tunnel oxide layer 210, a floating gate layer 220, a first oxide layer 231, a nitride layer 232, a second oxide layer 233, and a control gate layer 240 stacked sequentially from bottom to top along the normal direction of the substrate 100 above the substrate 100.

The first oxide layer 231, the nitride layer 232, and the second oxide layer 233 form an interlayer dielectric layer 230 (ONO) between the floating gate layer 220 and the control gate layer 240. Along the cut line of A-A', sidewalls 250 are formed on two sides of the tunnel oxide layer 210, the floating gate layer 220, the first oxide layer 231, the nitride layer 232, the second oxide layer 233, and the control gate layer 240 to protect the above layers.

The substrate 100 is an active area 110 viewed along the cut line of A-A', and in the embodiment shown in FIG. 3A, the active area 110 is a P-well of an N-channel memory cell and an N-source/drain ion implantation region of a memory transistor in the upper portion of the substrate 100. It is understood that P-type wells may be formed by P-type doping of the substrate 100, which may have dopants, such as boron (B) or other group III elements. The N-type source/drain ion implantation region may be formed by N-type doping on the upper portion of the substrate 100, and the N-type doping may have dopants, such As arsenic (As), phosphorus (P), other group V elements, or a combination thereof. It should be noted that the above-mentioned N-channel memory cell is only an illustration of the memory transistor in the flash memory device provided by the present disclosure, and those skilled in the art can change the doping type to set the P-channel memory cell as required, and the type of the memory transistor should not unduly limit the scope of the present disclosure.

Figure 3B:
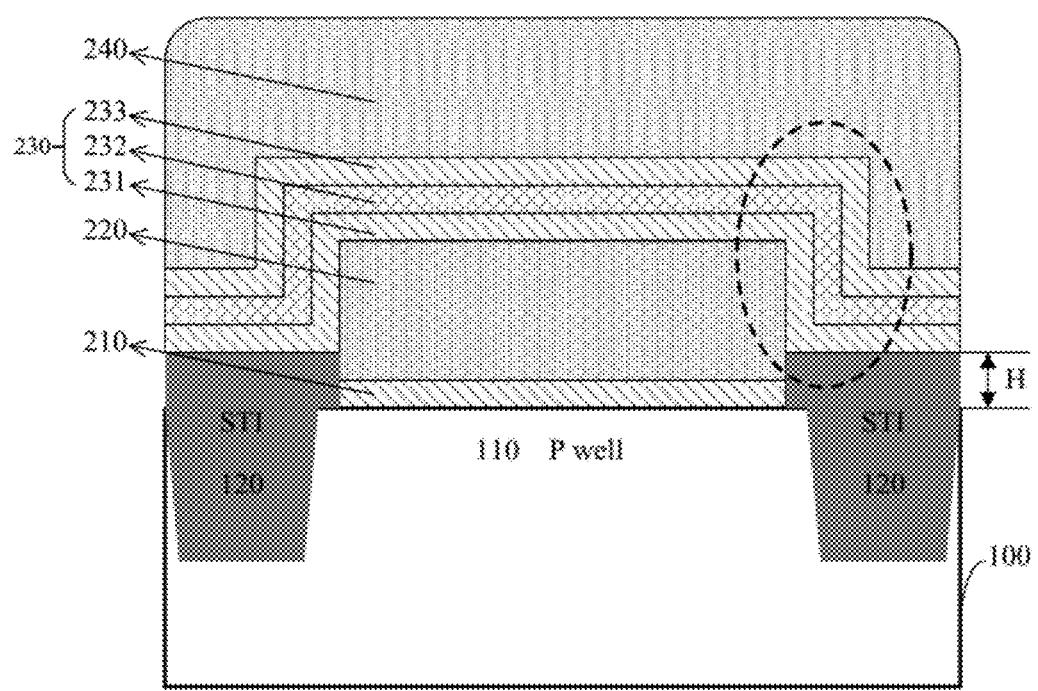
FIG. 3B shows a cross sectional view of the memory transistor/stack capacitor structure along the cut line B-B' in FIG. 2.

As shown in FIG. 3B, along the cut line B-B', the memory transistor comprises a substrate 100, and a tunnel oxide layer 210, a floating gate layer 220, a first oxide layer 231, a nitride layer 232, a second oxide layer 233, and a control gate layer 240 stacked sequentially from bottom to top along the normal direction of the substrate 100. The first oxide layer 231, the nitride layer 232, and the second oxide layer 233 form an interlayer dielectric layer 230 (ONO) between the floating gate layer 220 and the control gate layer 240. The control gate layer 240 and the interlayer dielectric layer 230 are extended along the B-B' direction.

In the B-B' direction, the substrate 100 comprises active area 110 and shallow trench isolations (STI) 120 which separate the active area 110. As described above, in the embodiment illustrated in FIG. 3B, the active area 110 are characterized as P-type well of an N-channel memory cell. It is understood that P-type well may be formed by P-type doping of the substrate 100, which may have dopants, such as boron (B) or other group III elements. It should be noted that the above-mentioned N-channel memory cell is only an illustration of the memory transistor in the flash memory device provided by the present disclosure, and those skilled in the art can change the doping type to set the P-channel memory cell as required, and the type of the memory transistor should not unduly limit the scope of the present disclosure.

Shallow trench isolation 120 not only serves to isolate each active area 110 in substrate 100 to define a plurality of memory transistors, but also comprises a portion (indicated by height H in FIG. 3B) above substrate 100, which is used as sidewall 250 to define floating gate layer 220, that means the upper surface of the portion of the shallow trench isolation above the substrate 100 is originally flush with floating gate layer 220. However, in the conventional memory transistor structure, the portion of the shallow trench isolation above the substrate 100 needs to be etched back, and FIG. 3B is a schematic diagram of the structure after the portion of the shallow trench isolation above the substrate 100 is etched back.

Just as the portion of the shallow trench isolation above the substrate 100 is etched back, the control gate layer 240 and the interlayer dielectric layer 230 of the memory transistor are stepped in the B-B' direction to surround the floating gate layer 220, as shown by the encircled portion in the dashed line box of FIG. 3B. This means that the contact length between the floating gate and the control gate in the B-B' direction is increased by twice the height of the portion of the shallow trench isolation being etched back.

The specific structure of the memory transistor in the flash memory device provided by the present disclosure has been clearly described with reference to FIGS. 2, 3A and 3B. As described above, some capacitor structures are necessary in the flash memory device, and the capacitor is formed by recombining different components of the flash memory device currently, so as to simplify the manufacturing process and save the manufacturing cost. Therefore, it can be understood that, in the flash memory device provided by the present disclosure, the capacitor structure is equivalently formed by using the above-mentioned memory transistor structure, as will be understood in conjunction with FIGS. 4, 5 and 6.

Figure 4:
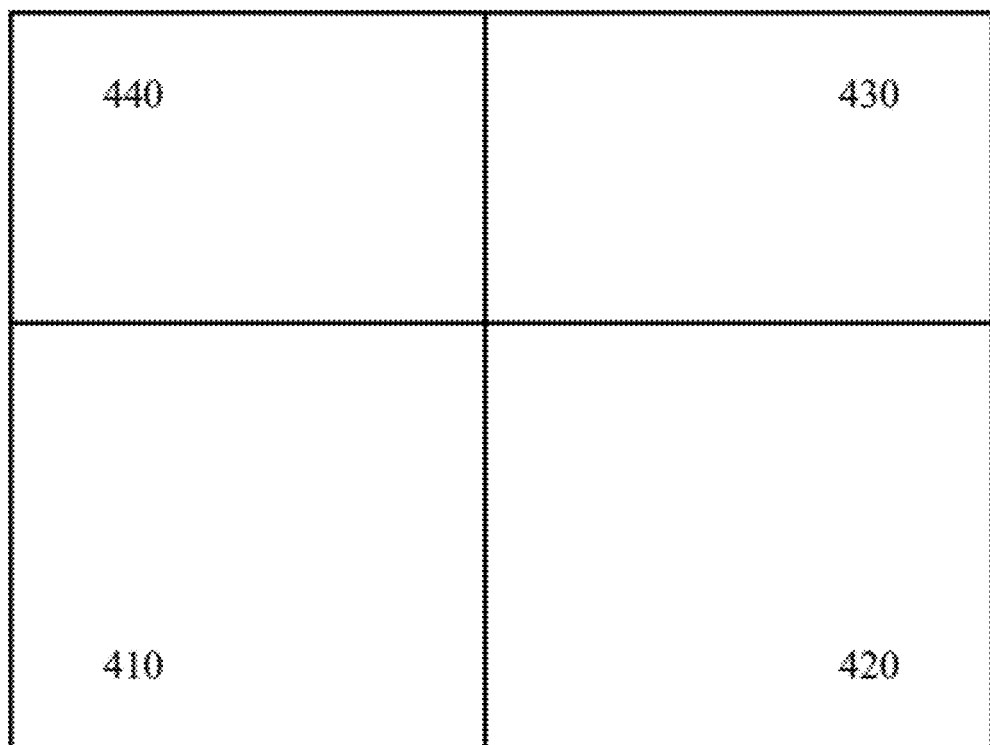
FIG. 4 shows a schematic top view of a portion of a flash memory device according to the present disclosure.

FIG. 4 is a schematic top view of a portion of a flash memory device 400 provided by the present disclosure, which comprises at least a memory transistor area 410, a stack capacitor area 420, a low voltage device area 440, and a high voltage device area 430, as shown in FIG. 4. The stack capacitor in the stack capacitor area 420 has the same structure as the memory transistor, that is, the memory transistor structure is formed in the stack capacitor area 420 at the same time as the memory transistor structure is formed in the memory transistor area 410, and the 'memory transistor' in the stack capacitor area 420 is used as the stack capacitor by subsequently changing the wiring relationship of the layers in the structure.

Figure 5:
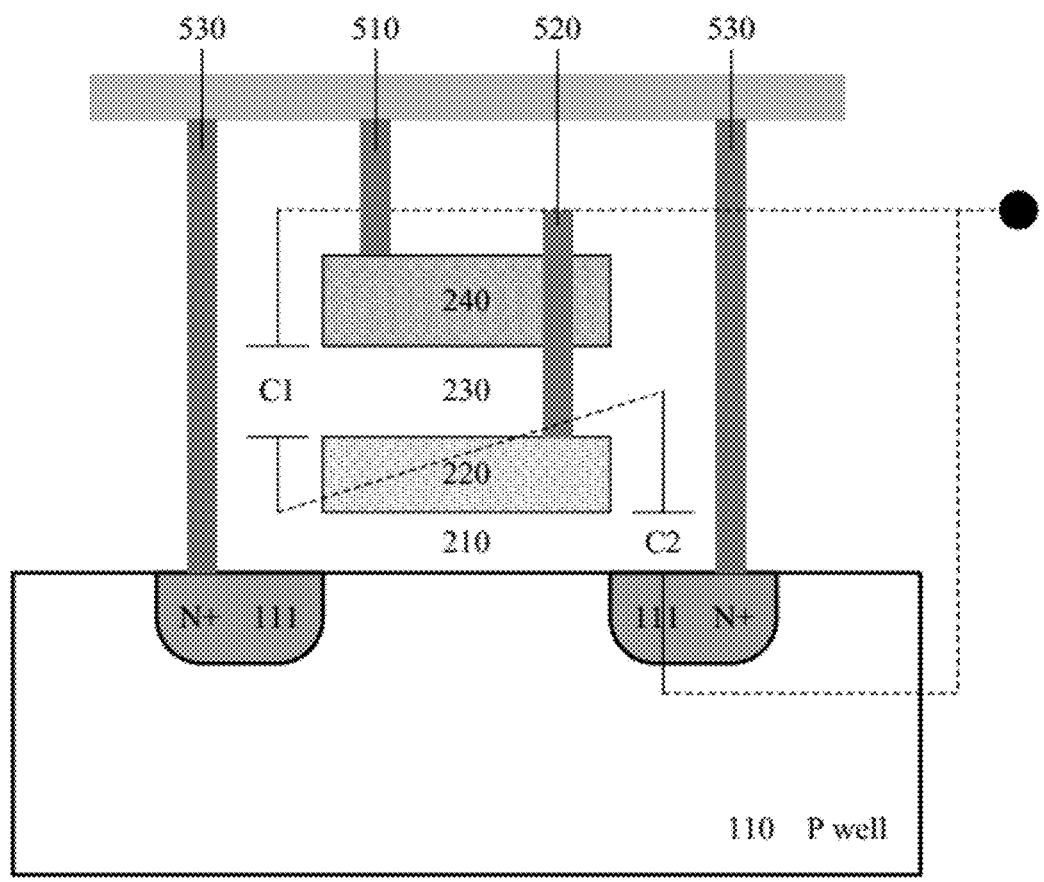
FIG. 5 shows a structure and a wiring diagram of the stack capacitor according to the present disclosure.

FIG. 5 shows a structure and a wiring diagram of a stack capacitor for realizing a stack capacitor effect by changing a wiring relationship of each layer using a memory transistor structure in a flash memory device provided by the present disclosure. FIG. 5 illustrates the stack capacitor structure and the wiring relationship from A-A' direction of FIG. 2. As shown in FIG. 5, the stack capacitor structure comprises a first contact 510 that leads out of control gate layer 240, a second contact 520 that leads out of floating gate layer 220, and third contacts 530 that lead out of source/drain regions 111. From the electrical principle, it can be known that, by conducting the first contact 510 and the second contact 520, the capacitance C1 is formed by using the interlayer dielectric layer 230 as the intermediate insulating layer and using the control gate layer 240 and the floating gate layer 220 as a pair of electrode plates. By turning on the second contact 520 and the third contacts 530, a capacitor C2 is formed by the tunnel oxide layer 210 acting as an intermediate insulating layer and using the floating gate layer 220 and the substrate 100 as a pair of electrode plates.

Figure 6:
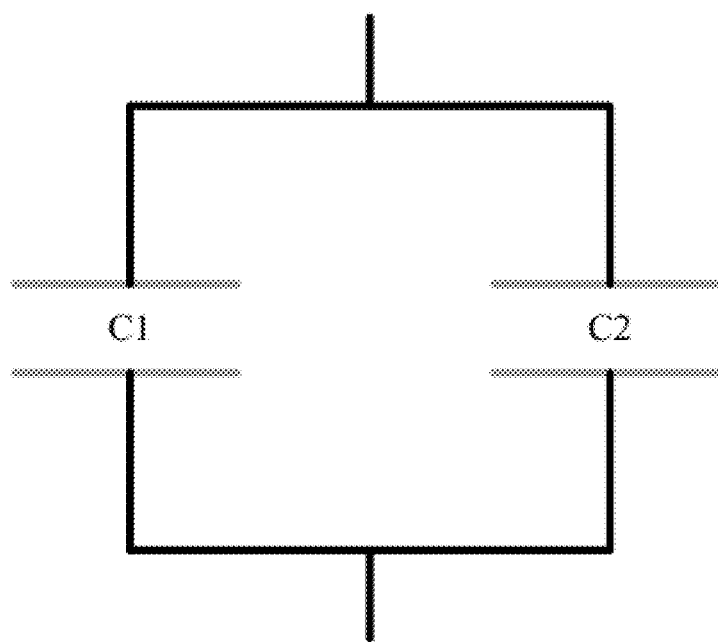
FIG. 6 shows an equivalent circuit diagram of the stack capacitor according to the present disclosure.

In order to increase the effective capacitance per unit area, the first contact 510 and the third contacts 530 may be connected in parallel according to the electrical principle, so that the capacitor C1 is connected in parallel with the capacitor C2, and the total capacitance of the stack capacitor structure is C1+C2, as shown in FIG. 6. It is understood that the capacitance of the capacitor C1 is determined by the thickness of the interlayer dielectric layer 230, which is referred to as the equivalent electrical thickness (or Equivalent Oxide Thickness, EOT). Similarly, the capacitance of the capacitor C2 is determined by the EOT of the tunnel oxide layer 210.

Figure 7A:
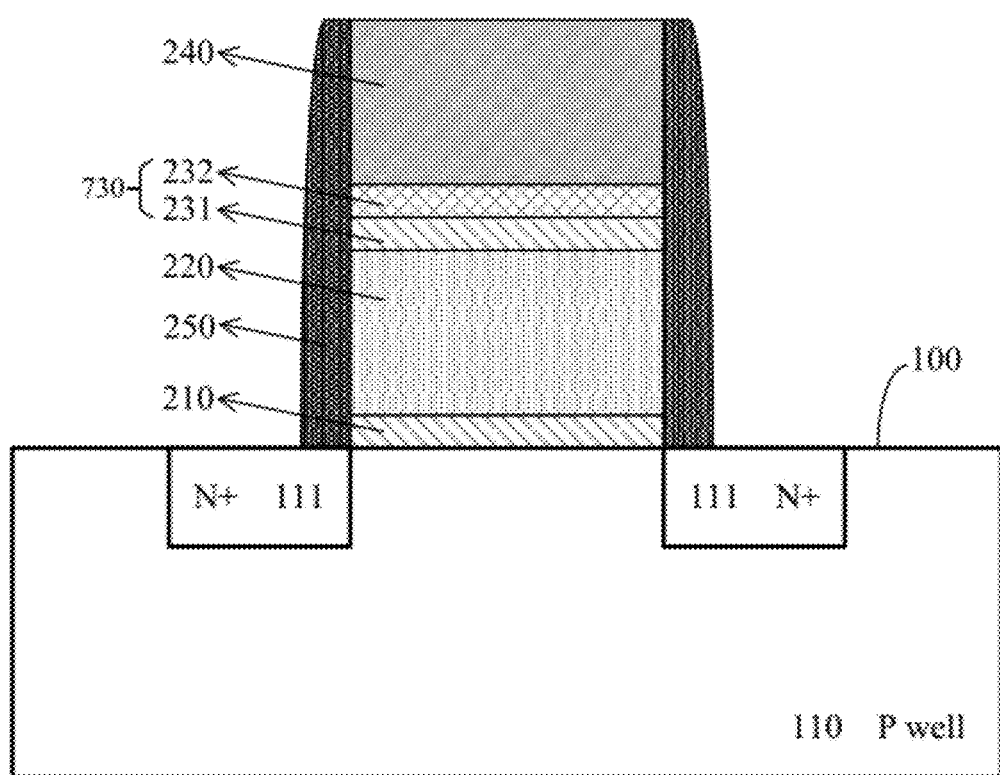
FIG. 7A shows a cross sectional view of the stack capacitor structure along the cut line of A-A' in FIG. 2 according to a preferred embodiment.
Figure 7B:
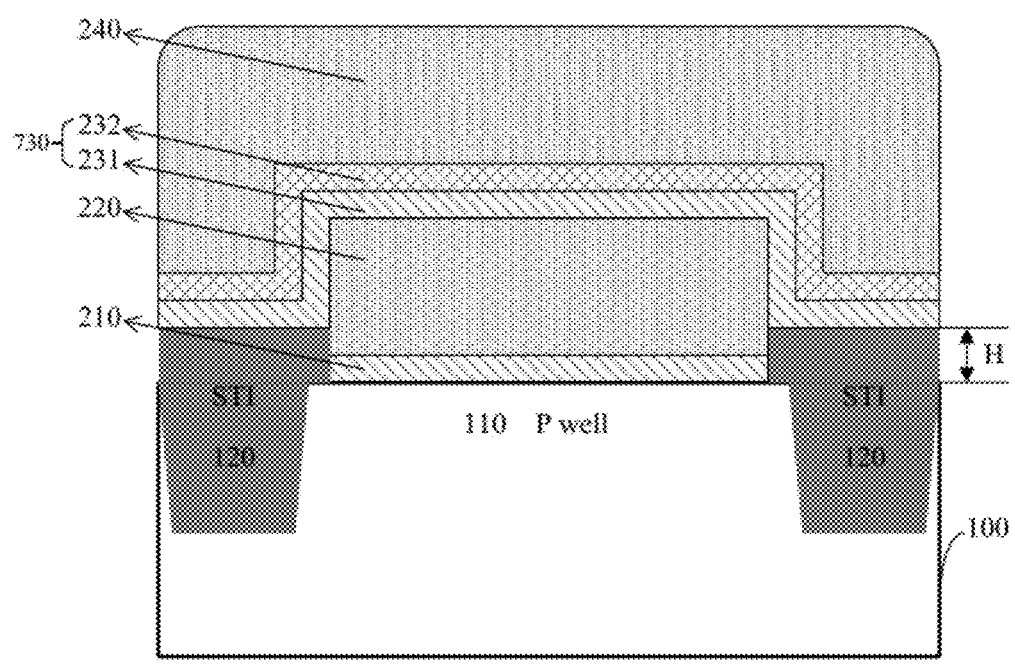
FIG. 7B shows a cross sectional view of the stack capacitor structure along the cut line of B-B' in FIG. 2 according to a preferred embodiment.

In the embodiments of the stack capacitor structure provided by the present disclosure, the effective capacitance per unit area can be increased, thereby providing the possibility of reducing the device size. In another preferred embodiment, the stack capacitor structure provided by the present disclosure can further increase the effective capacitance compared with the above embodiments. FIGS. 7A and 7B explain the stack capacitor structure as a preferred embodiment of the present disclosure.

FIGS. 7A, 7B respectively show preferred stack capacitor structures along cut lines of A-A' and B-B' in FIG. 2. In FIGS. 7A and 7B, compared to the stack capacitor structures shown in FIGS. 3A and 3B, the interlayer dielectric layer 730 of the stack capacitor structure shown in FIGS. 7A and 7B comprises (retains) only the first oxide layer 231 and the nitride layer 232 stack in sequence from bottom to top along the normal direction of the substrate 100, and does not include the second oxide layer 233 shown in FIGS. 3A and 3B.

Because the thickness of the interlayer insulating layer between the floating gate layer 220 and the control gate layer 240 is reduced, the capacitance of the capacitor C1 is improved, so that the capacitance after parallel connection is improved, the full stack capacitance is improved, so the effective capacitance per unit area is improved, the occupied logic area is reduced, the size of the memory unit is reduced consequently, therefore the advantages and the competitiveness of the small-size memory unit are ensured.

Referring to Table 1, which is a related electrical parameter after electrical testing of the stack capacitor structure shown in FIGS. 3A and 3B and FIGS. 7A and 7B, the data in Table 1 confirms that the stack capacitor structure of the preferred embodiment effectively improves the capacitance, and achieves the technical effects described above.

TABLE 1

| Type | Equivalent electrical thickness/Å | Capacitance/ F/100 um^2 |
|---|---|---|
| Tunneling silicon oxide (Tox) | 98.1 | 3.52E−13 |
| Conventional interlayer dielectric layer (ONO) | 139.2 | 2.48E−13 |
| Improved interlayer dielectric layer (ON) | 100 | 3.45E−13 |
| Existing stack capacitor(Stack) | 57.5 | 6.00E−13 |
| Improved stack capacitor(Stack) | 49.5 | 6.97E−13 |
| New Stack capacitance/Existing Stack capacitance Ratio | | 16% |

Figure 8A:
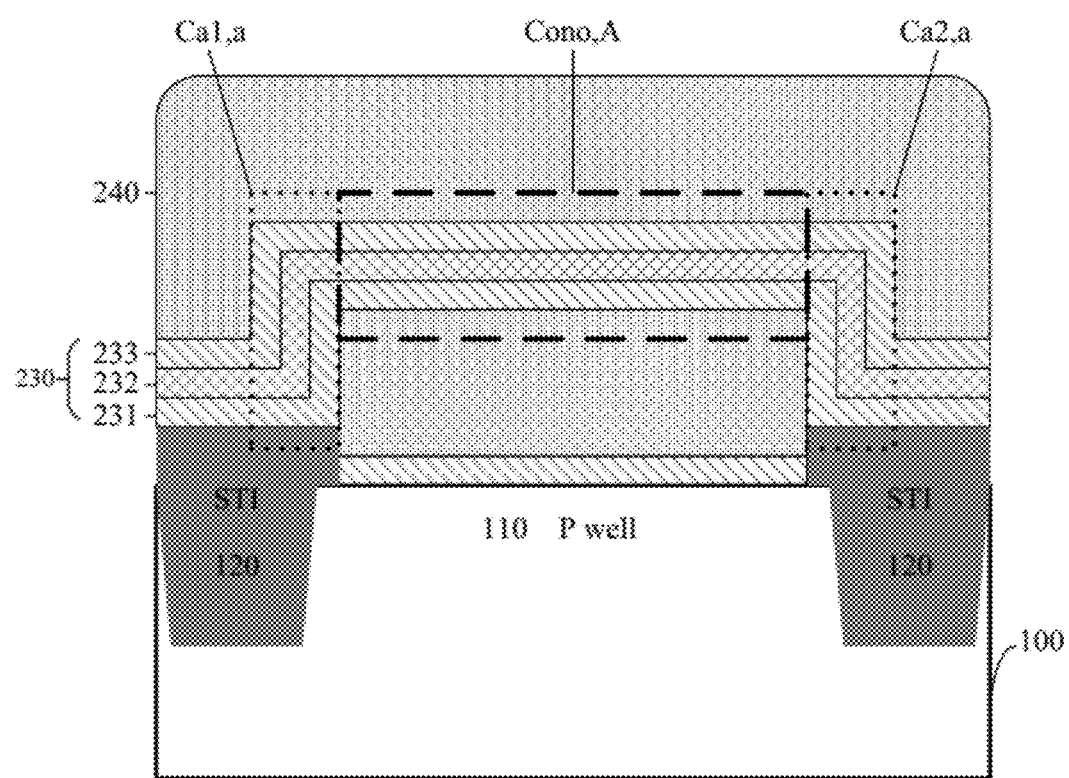
FIG. 8A further identifies the equivalent capacitance between different regions of the interlayer dielectric layer of FIG. 3B.
Figure 8B:
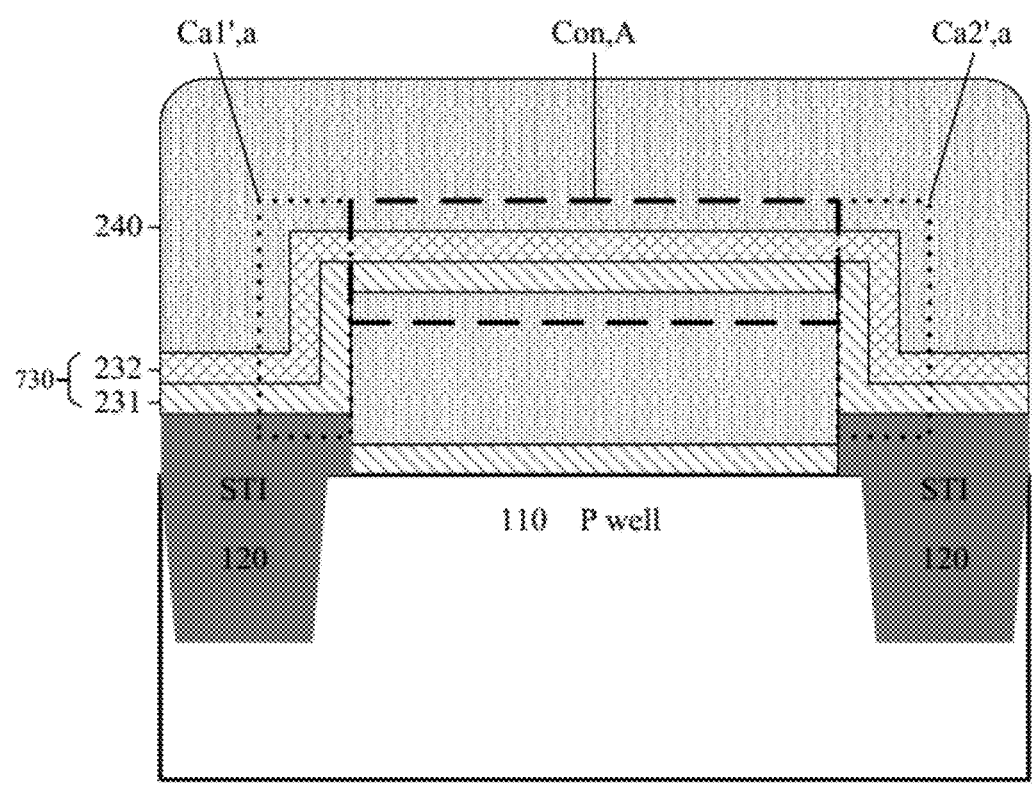
FIG. 8B further identifies the equivalent capacitance between different regions of the interlayer dielectric layer of FIG. 7B.

As described above, in the stack capacitor structure provided by the present disclosure, since the portion of the shallow trench isolation defining the floating gate layer 220 over the substrate 100 is etched back, the interlayer dielectric layer and the control gate layer 240 surround the floating gate layer 220 in a step shape, in fact, the surrounded portions on both sides of the floating gate layer 220 may also form additional capacitors with the control gate layer 240, as shown in FIGS. 8A and 8B. Although the effective capacitance per unit area can be increased to a certain extent by the additional capacitors, the capacitance of the whole stack capacitor structure is easy to be unstable due to the variation of the thickness of the floating gate and the uncertainty of the variable height of the shallow trench isolation portion being etched back, so that the performance of the circuit is adversely affected.

As can be appreciated by those skilled in the art, for FIG. 8A, the equivalent electrical thickness (EOT) of the interlayer dielectric layer 230 of the stack capacitor in the Wafer Acceptance Test (WAT) can be calculated by the following formula:

$$EOT(WAT) = \varepsilon 0 \varepsilon r * A / (Ca1 + Cono + Ca2)$$

In practice, the equivalent electrical thickness EOT of the interlayer dielectric layer 230 in the stack capacitor can be calculated by the following formula:

$$EOT(Real) = \varepsilon 0 \varepsilon r * (A + n*2a) / (n*Ca1 + Cono + n*Ca2)$$

Wherein, ε0 is a vacuum dielectric constant; εr is the relative dielectric constant of silicon oxide; A and a respectively refer to the area of electrode; Ca1, Cono, and Ca2 respectively refer to the measured capacitances; n represents the structural index of the sample wherein n is 1 in a block structure, and n is the number of fingers in a finger structure.

For a block structure, EOT(WAT)<EOT(Real); for finger structures, EOT(WAT)<<EOT(Real), that is, for finger structures, the presence of Ca1 and Ca2 has a large impact on the test accuracy.

In contrast to FIG. 8B, the equivalent electrical thickness EOT of the interlayer dielectric layer 730 in the Wafer Acceptance Test (WAT) of the stack capacitor shown in FIG. 8B can be calculated by the following formula:

$$EOT(WAT) = \varepsilon 0 \varepsilon r * A / (Ca1' + Con + Ca2')$$

In practice, the equivalent electrical thickness EOT of the interlayer dielectric layer 730 in the stack capacitor shown in FIG. 8B can be calculated by the following formula:

$$EOT(Real) = \varepsilon 0 \varepsilon r * (A + n*2a) / (n*Ca1' + Con + n*Ca2')$$

Wherein, Ca1', Con and Ca2' respectively refer to measured capacitance.

The EOT of the interlayer dielectric layer 730 in the stack structure is decreased due to the increase of Ca1', Ca2' and Con compared to Ca1, Ca2 and Cono. However, since A is much larger than a, the increase of Ca1' and Ca2' is less changed compared with the increase of Con, and therefore, the influence of Ca1' and Ca2' on the capacitance of the whole stack capacitor structure can be eliminated to a certain extent by decreasing the thickness of the interlayer dielectric layer 730 and increasing the extra capacitance, so that the test accuracy can be effectively improved. That is, the defects in the structures shown in FIGS. 3A and 3B can be effectively improved by the preferred embodiment of the stack capacitor structure provided by the present disclosure.

According to the preferred embodiment of the stack capacitor structure provided by the invention, the capacitance of the stack capacitor can be further improved by reducing the thickness of the interlayer dielectric layer, and the capacitance per unit area can be effectively improved under the condition of ensuring the stability of the stack capacitor, so that the area occupied by a logic area can be reduced, the size of a memory unit can be continuously reduced, and the advantages and the competitiveness of a small-size memory unit can be ensured.

It should be noted that although the capacitance of C1 can be effectively increased by decreasing the thickness of the interlayer dielectric layer between the floating gate layer 220 and the control gate layer 240, the interlayer dielectric layer needs to be controlled not to be too thin in order to ensure the reliability of the device and avoid breakdown due to the reduced thickness of the interlayer dielectric layer. According to the electrical principle, the equivalent electrical thickness of the improved interlayer dielectric layer 730 (comprising the first oxide layer 231 and the nitride layer 232) still needs to be controlled to be larger than the equivalent electrical thickness of the tunnel oxide layer 210, that is, the equivalent electrical thickness of the improved interlayer dielectric layer 730 is controlled to be slightly larger than the equivalent electrical thickness of the tunnel oxide layer 210, so as to ensure that the tunnel oxide layer 210 is a weaker end for the voltage applied by the floating gate layer 220, and the reliability of the device can be prevented from being influenced while the effective capacitance per unit area is improved.

The invention also provides a flash memory device comprising the preferred embodiment of the stack capacitor structure and a manufacturing method of the flash memory device. Meanwhile, the manufacturing method provided by the invention does not add any photomask, thereby not causing the increase of the manufacturing cost. In addition, the manufacturing method provided by the invention can be compatible with the existing process flow in the process flow and has universality.

As described above, FIG. 4 shows a schematic top view of a partial area of a flash memory device 400 provided by the present disclosure. For the low voltage device area 440 and the high voltage device area 430, both devices comprise a substrate, a gate over the substrate, and a gate oxide between the substrate and the gate. It will be appreciated that the low voltage devices have gate oxide layers of different thicknesses than the high voltage devices, with the gate oxide layer of the high voltage devices being thicker and the gate oxide layer of the low voltage devices being thinner. In the conventional manufacturing process of the flash memory device, in order to reduce the negative effect of the low-voltage region ion implantation on the thinner gate oxide layer, a thick silicon oxide layer is usually formed in the low-voltage device region 440 and the high-voltage device region 430 simultaneously, and then after the low-voltage device region 440 is ion implanted, the thick silicon oxide layer in the low-voltage device region 440 is removed, and a thin silicon oxide layer is formed in the corresponding region.

Figure 9A:
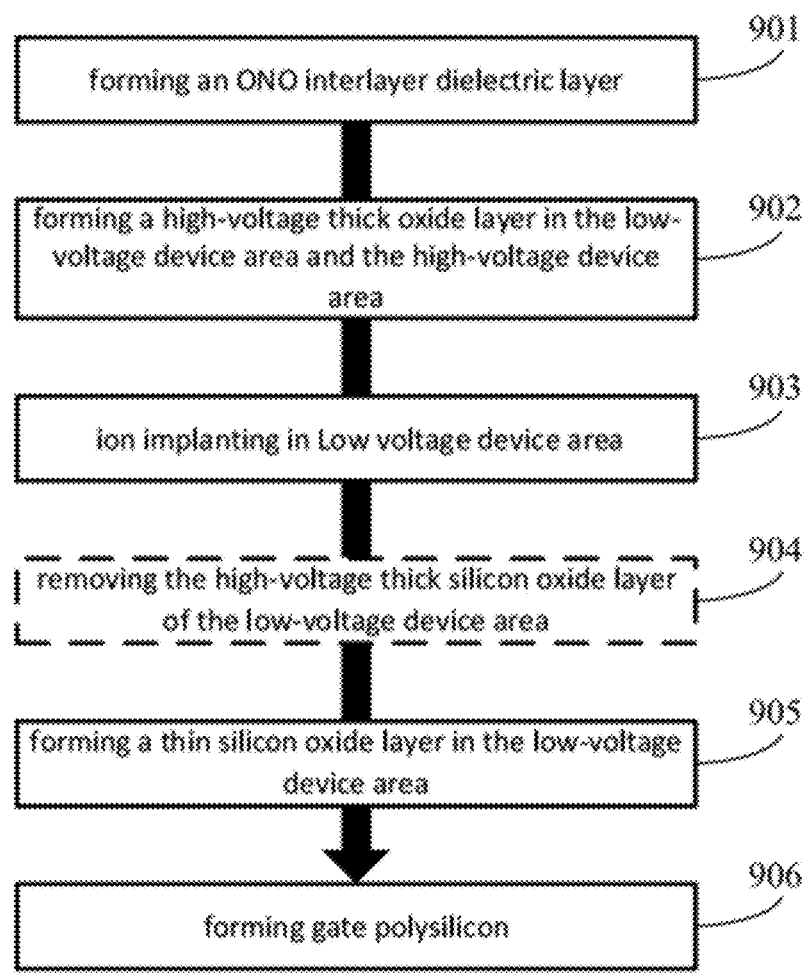
FIG. 9A shows a partial process flow of a flash memory device in the related art.

FIG. 9A shows a portion of a process flow of a current flash memory device. As shown in FIG. 9A, the conventional partial process comprises: step 901, forming an ONO interlayer dielectric layer in the memory transistor area 410 and the stack capacitor area 420; step 902, synchronously forming a thick silicon oxide layer of the high-voltage device area 430 on the low-voltage device area 440 and the high-voltage device area 430; step 903, implanting ions into the low-voltage device area 440; step 904, removing the thick silicon oxide layer of the low-voltage device area 440; step 905, forming a thin silicon oxide layer in the low-voltage device area 440; and step 906: forming gate polysilicon.

Figure 10A:
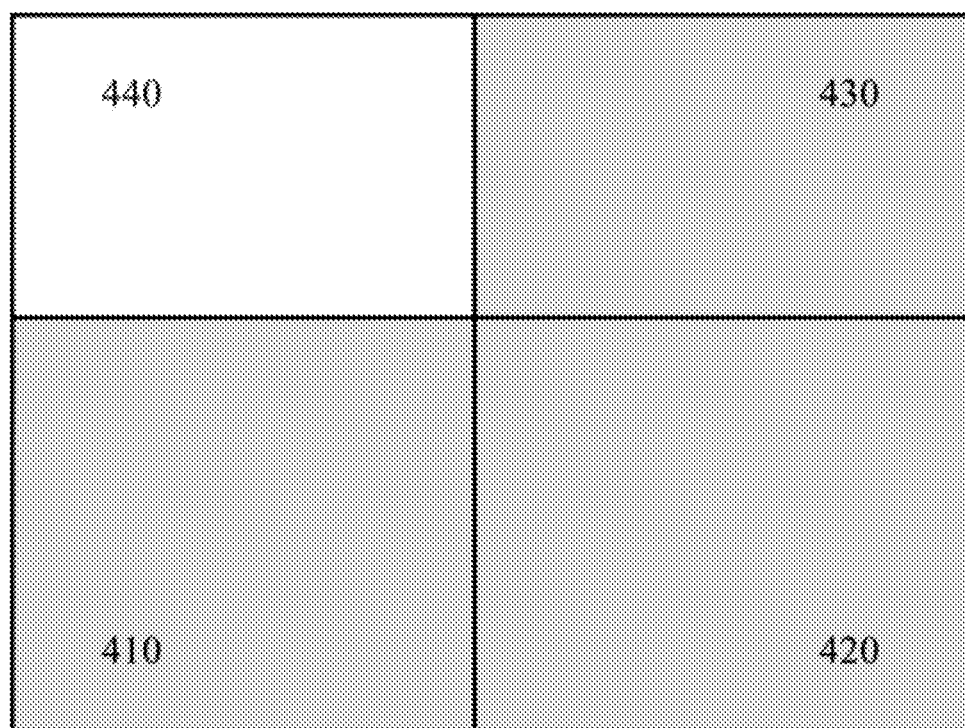
FIG. 10A shows a schematic top view of an intermediate structure of the flash memory device in step 904 of FIG. 9A.

In particular, at step 904, referring to FIG. 10A in addition, the top view of the flash memory device 400 of FIG. 10A shows the conventional method of removing only the thick silicon oxide layer of the low voltage device area 440. In the present disclosure, since the oxide layer on the top of the interlayer dielectric layer in the stack capacitor needs to be removed to reduce the thickness of the interlayer dielectric layer between the floating gate layer 220 and the control gate layer 240 and increase the effective capacitance per unit area, the manufacturing method provided by the present disclosure changes step 904, so that the thick silicon oxide layer of the low voltage device and the silicon oxide layer on the top of the interlayer dielectric layer of the stack capacitor can be removed together in the improved step 904'.

Figure 9B:
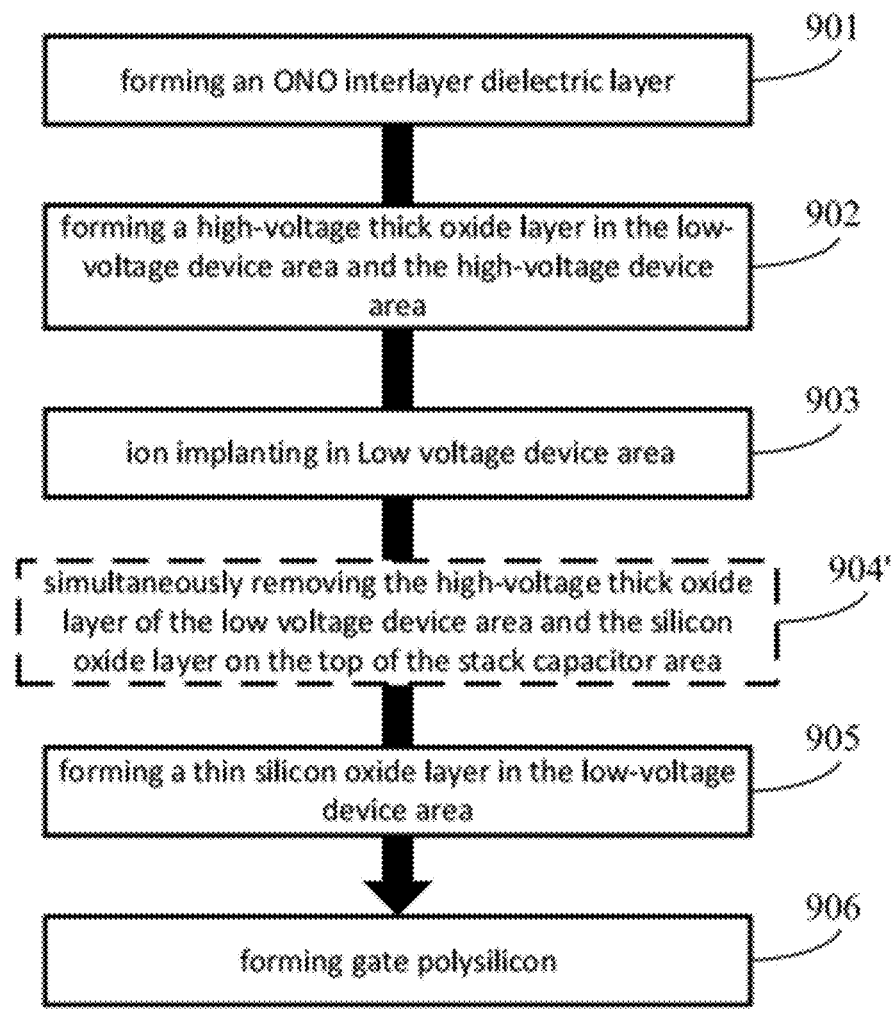
FIG. 9B shows a partial process flow of a flash memory device according to one embodiment of the present disclosure.
Figure 10B:
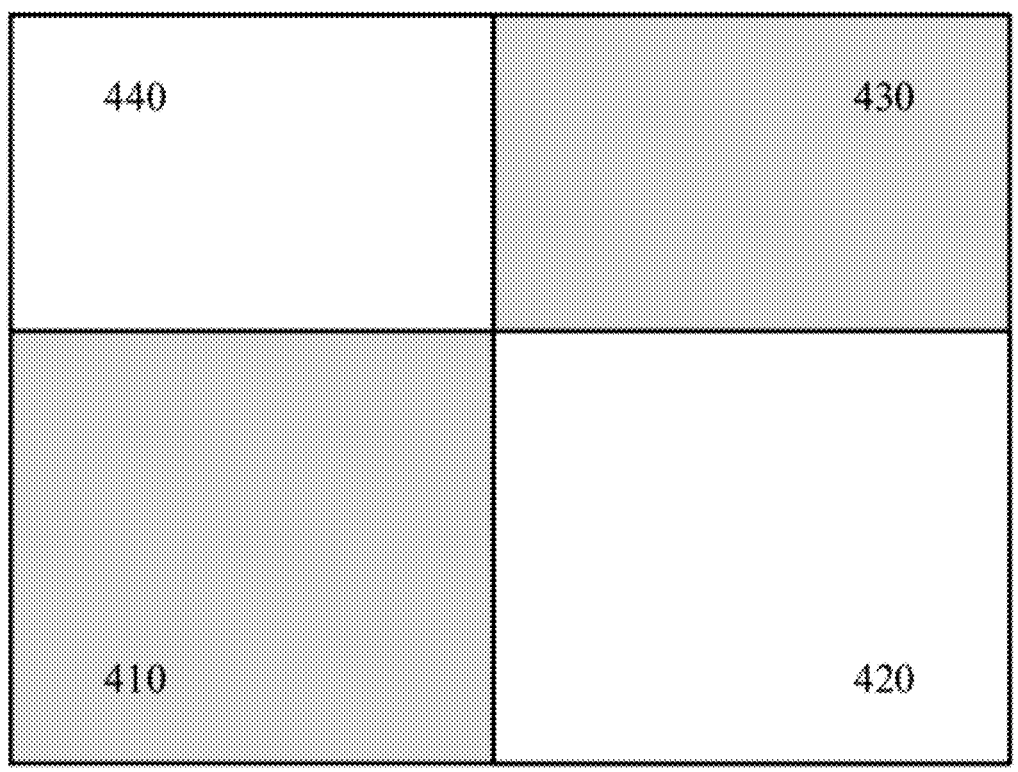
FIG. 10B shows a schematic top view of the intermediate structure of the flash memory device in step 904' in FIG. 9B.

FIG. 9B illustrates a partial process flow of a flash memory device according to the present disclosure. Wherein steps 901 to 903 and steps 905 and 906 are the same as those of the prior art. The improved step 904' is: simultaneously removing the high-voltage thick-oxide layer of the low voltage device area 440 and the silicon oxide layer on the top of the stack capacitor area 420. Referring to FIG. 10B, as shown in FIG. 10B, not only removed the thick silicon oxide layer of the low voltage device area 440, but also got rid of the second oxide layer 230 at the top of the interlayer dielectric layer of the stack capacitor region 420.

It will be understood by those skilled in the art that the silicon oxide layer can be removed by existing or future etching means, mechanical polishing means, etc. In an embodiment of the present disclosure, for the second oxide layer 230 of the stack capacitor region 420, the etching process is stopped by taking the underlying nitride layer 232 as an etching stop layer, and finally it is stopped on the nitride layer 232.

In the improved process flow provided by the present disclosure, the region where the silicon oxide layer needs to be removed can be adjusted by only changing the mask used in the previous step 904, that is, no additional mask is added to the existing process, thus no extra process cost is added. Moreover, the manufacturing process provided by the invention is compatible with the existing process flow and highly adaptable.

Although not shown in FIG. 9B, it should be understood by those skilled in the art that in order to enable the 'memory transistor' structure in the stack capacitor area 420 to be used as a capacitor, in the back-end-of-line (BEOL), it is necessary to form not only contacts for leading out of the memory gate layer and the source/drain ion implantation region, but also contacts for leading out of the floating gate layer 220. Meanwhile, the contact connection relationship between the control gate layer and the source/drain ion implantation region needs to be changed, that is, the contact of the control gate layer needs to be connected in parallel with the contact of the source/drain ion implantation region.

Thus, various embodiments of the stack capacitor structure, the flash memory device comprising the stacked structure, and the manufacturing method thereof provided by the present disclosure have been described. According to the stack capacitor, the flash memory device and the manufacturing method thereof provided by the present disclosure, the original thick silicon oxide removing step in the prior art is utilized in the stack capacitor area, and the silicon oxide on the uppermost layer of the interlayer dielectric layer (ONO, silicon oxide-silicon nitride-silicon oxide) between the floating gate layer and the control gate layer is removed (silicon nitride is utilized as a stop layer). The capacitance of the stack capacitor can be improved by reducing the thickness of the interlayer dielectric layer. The capacitance per unit area can be effectively improved under the condition of ensuring the stability of the stack capacitor, so that the occupied area of a logic area can be reduced, the size of per memory unit can be continuously reduced, and the advantages and the competitiveness of a small-size memory unit can be ensured. The manufacturing method provided by the invention does not add any photomask, thereby not causing the increase of the manufacturing cost. In addition, the manufacturing method provided by the invention can be compatible with the existing process flow in the process flow and has universality.

Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method of a flash memory device, wherein the flash memory device comprises a substrate comprising at least a memory transistor area and a stack capacitor area, wherein the method comprises:
   orderly and sequentially forming a tunneling oxide layer, a floating gate layer and an interlayer dielectric layer, wherein the interlayer di electric layer comprises a first oxide layer, a nitride layer and a second oxide layer in the memory transistor area and the stack capacitor area on the substrate;
   removing the second oxide layer from a top of the interlayer dielectric layer of the stack capacitor area;
   forming a control gate layer and a first contact leading out of the control gate layer over the interlayer dielectric layer on both the memory transistor area and the stack capacitor area; and
   forming a second contact leading out of the floating gate layer of the stack capacitor area, so that the floating gate layer and the control gate layer of the stack capacitor area form a pair of electrodes of the stack capacitor under an applied voltage.

2. The manufacturing method of claim 1, further comprising:
   synchronously forming source and drain regions in a top surface of the substrate of the memory transistor area and the stack capacitor area;
   forming third contacts for leading out of the source and drain regions of the stack capacitor area; and
   connecting the third contacts in parallel with the first contact of the stack capacitor area, so that the floating gate layer and the substrate of the stack capacitor area form another pair of electrodes of the stack capacitor under an applied voltage.

3. The manufacturing method of claim 1, wherein removing the second oxide layer on a top of the interlayer dielectric layer of the stack capacitor area further comprises:
   removing the second oxide layer by using the nitride layer of the interlayer dielectric layer in the stack capacitor area as an etching stop layer so as to control an equivalent electrical thickness of the interlayer dielectric layer in the stack capacitor area to be slightly greater than a thickness of the tunneling oxide layer.

4. The manufacturing method of claim 3, wherein the substrate further comprises a low-voltage device area, wherein a low-voltage device in the low-voltage device area comprises at least a control gate of the low-voltage device over the substrate, and an interlayer dielectric layer of the low-voltage device between the substrate and the control gate of the low-voltage device;
   wherein the manufacturing method further comprises:
   forming the interlayer dielectric layer of the low-voltage device, at least comprising a high-voltage thick-oxide layer above the low-voltage device area of the substrate;
   wherein the removing the second oxide layer from the top of the interlayer dielectric layer of the stack capacitor area further comprises:
   synchronously removing the high-voltage thick-oxide layer from a top of the interlayer dielectric layer of the low-voltage device area.

5. The manufacturing method of claim 3, further comprising:
   forming a low-voltage thin-oxide layer with a thickness smaller than a thickness of the second oxide layer above the substrate of the low-voltage device area, after the high-voltage thick-oxide layer of the low-voltage device area is removed.

* * * * *